US012729166B2

(12) United States Patent
Yasseri et al.

(10) Patent No.: US 12,729,166 B2
(45) Date of Patent: Sep. 8, 2026

(54) TREATED CERAMIC CHAMBER PARTS

(71) Applicant: Lam Research Corporation, Fremont, CA (US)

(72) Inventors: Amir A. Yasseri, San Jose, CA (US); Hong Shih, Cupertino, CA (US); Satish Srinivasan, Newark, CA (US); Jeremiah Michael Dederick, Livermore, CA (US); Pankaj Hazarika, Sherwood, OR (US); Lin Xu, Fremont, CA (US); Douglas Detert, Berkeley, CA (US)

(73) Assignee: Lam Research Corporation, Fremont, CA (US)

( * ) Notice: Subject to any disclaimer, the term of this patent is extended or adjusted under 35 U.S.C. 154(b) by 176 days.

(21) Appl. No.: 18/577,889

(22) PCT Filed: Aug. 4, 2022

(86) PCT No.: PCT/US2022/039431
§ 371 (c)(1),
(2) Date: Jan. 9, 2024

(87) PCT Pub. No.: WO2023/022890
PCT Pub. Date: Feb. 23, 2023

(65) Prior Publication Data

US 2024/0308926 A1 Sep. 19, 2024

Related U.S. Application Data

(60) Provisional application No. 63/234,999, filed on Aug. 19, 2021.

(51) Int. Cl.

| | |
|---|---|
| ***C04B 41/00*** | (2006.01) |
| ***B24C 1/00*** | (2006.01) |
| ***H01J 37/32*** | (2006.01) |

(52) U.S. Cl.
CPC .......... *C04B 41/0072* (2013.01); *B24C 1/003* (2013.01); *H01J 37/32495* (2013.01)

(58) Field of Classification Search
CPC ................. B24C 1/003; C04B 41/0072; H01J 37/32119; H01J 37/32238; H01J 37/32431; H01J 37/32495
See application file for complete search history.

(56) References Cited

U.S. PATENT DOCUMENTS

| | | | |
|---|---|---|---|
| 9,428,424 | B2 | 8/2016 | Duan et al. |
| 11,817,339 | B2 | 11/2023 | Hidaka et al. |

(Continued)

FOREIGN PATENT DOCUMENTS

| | | |
|---|---|---|
| JP | 2006-310881 | 11/2006 |
| KR | 10-2016-0130250 | 11/2016 |

(Continued)

OTHER PUBLICATIONS

Luo CN 101255056 A (Year: 2008).*

(Continued)

*Primary Examiner* — Lawrence D Ferguson
(74) *Attorney, Agent, or Firm* — Beyer Law Group LLP

(57) ABSTRACT

A method for treating a ceramic component for use in a semiconductor processing chamber, wherein the ceramic component comprises a ceramic laminate comprising a base zone comprising a first dielectric ceramic material, a protective, wherein the protective zone comprises a second dielectric ceramic material, and a transition zone between the protective zone and base zone, wherein the transition zone comprises the first dielectric ceramic material and the second dielectric ceramic material, wherein exposure of the ceramic component to UV light changes an optical property of at least a first part of the ceramic component is provided. A heat treatment of the ceramic component is provided by (Continued)

heating the ceramic component in a furnace to a temperature of between 400° C. to 1000° C. for a period between 2 hours to 20 hours, wherein the heat treatment changes the optical property of the first part of the ceramic component.

6 Claims, 5 Drawing Sheets

(56) References Cited

U.S. PATENT DOCUMENTS

| | | | |
|---|---|---|---|
| 2006/0205097 | A1 | 9/2006 | Kadotani et al. |
| 2010/0086805 | A1 | 4/2010 | Lin et al. |
| 2012/0251819 | A1 | 10/2012 | Buhay et al. |
| 2015/0251961 | A1 | 9/2015 | Duan et al. |

FOREIGN PATENT DOCUMENTS

| | | |
|---|---|---|
| TW | 201946204 | 12/2019 |
| WO | 2019-136396 | 7/2019 |

OTHER PUBLICATIONS

Taiwanese Office Action from Taiwanese Application No. 111130550 dated Nov. 18, 2025 with Machine Translation.
International Search Report and Written Opinion from International Application No. PCT/US2022/039431 dated Dec. 1, 2022.
Korean Office Action from Korean Application No. 10-2024-7009093 dated Feb. 12, 2026 with Machine Translation.

* cited by examiner

300
POWER MATCHING NETWORK
308
306
PLASMA POWER SUPPLY
324
CONTROLLER
240
340
341
310
372
376
314
366
364
360
GAS SOURCE
330
302
304
PRESSURE CONTROL VALVE
342
BIAS MATCHING NETWORK
318
PUMP
344
BIAS VOLTAGE POWER SUPPLY
316

TREATED CERAMIC CHAMBER PARTS

CROSS-REFERENCE TO RELATED APPLICATION

This application claims the benefit of priority of U.S. Application No. 63/234,999, filed Aug. 19, 2021, which is incorporated herein by reference for all purposes.

BACKGROUND

The background description provided here is for the purpose of generally presenting the context of the disclosure. Information described in this background section, as well as aspects of the description that may not otherwise qualify as prior art at the time of filing, are neither expressly nor impliedly admitted as prior art against the present disclosure.

The disclosure relates to parts for use in a processing chamber. More specifically, the disclosure relates to a dielectric window for use for passing power into a plasma processing chamber.

Some components of semiconductor processing chambers, such as dielectric windows, are exposed to plasmas. The plasma may cause degradation and visual color changes to the dielectric window. The degradation of the dielectric and accumulation of chamber byproducts on the window may create contaminants that can cause the failure of the semiconductor devices. In addition, new parts may have contaminants from manufacturing that can cause the failure of the semiconductor devices. For laminated ceramic parts, contaminants on a part may be caused during the manufacturing of the part or use of the part. In addition, manufacturing of the part or usage of the part may cause the part to change color which may not necessarily correlate with defectivity but rather raise customer perception concerns regarding part quality assurance for chamber matching. The color change may be nonuniform. Laminated ceramic parts may have pits that are less than 5 microns in width. It may be difficult to remove debris from pits that are less than 5 microns in width.

SUMMARY

To achieve the foregoing and in accordance with the purpose of the present disclosure, a method for treating a ceramic component for use in a semiconductor processing chamber, wherein the ceramic component comprises a ceramic laminate comprising 1) a base zone comprising a first dielectric ceramic material, 2) a protective zone on a first side of the base zone, wherein the protective zone comprises a second dielectric ceramic material, wherein the first dielectric ceramic material is different than the second dielectric ceramic material, and 3) a transition zone between the protective zone and base zone, wherein the transition zone comprises the first dielectric ceramic material and the second dielectric ceramic material, wherein exposure of the ceramic component to UV light changes an optical property of at least a first part of the ceramic component from a first optical state to a second optical state is provided. A heat treatment of the ceramic component is provided by heating the ceramic component in a furnace to a temperature of between 400° C. to 1000° C. for a period between 2 hours to 20 hours, wherein the heat treatment changes the optical property of the first part of the ceramic component from the second optical state to a third optical state, wherein the third optical state is closer to the first optical state than the second optical state.

In another manifestation, a ceramic component, for use in a semiconductor processing chamber, wherein the ceramic component has a process facing surface with a plurality of pits with diameters less than 5 μm that are on average less than 15% filled with debris.

In another manifestation, a method for treating a ceramic component for use in a semiconductor processing chamber, wherein the ceramic component comprises a ceramic laminate comprising 1) a base zone comprising a first dielectric ceramic material, 2) a protective zone on a first side of the base zone, wherein the protective zone comprises a second dielectric ceramic material, wherein the first dielectric ceramic material is different than the second dielectric ceramic material, and 3) a transition zone between the protective zone and base zone, wherein the transition zone comprises the first dielectric ceramic material and the second dielectric ceramic material is provided. A heat treatment of the ceramic component is provided by heating the ceramic component in a furnace to a temperature of between 400° C. to 1000° C. for a period between 2 hours to 20 hours These and other features of the present disclosure will be described in more detail below in the detailed description and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION

Figure 1:
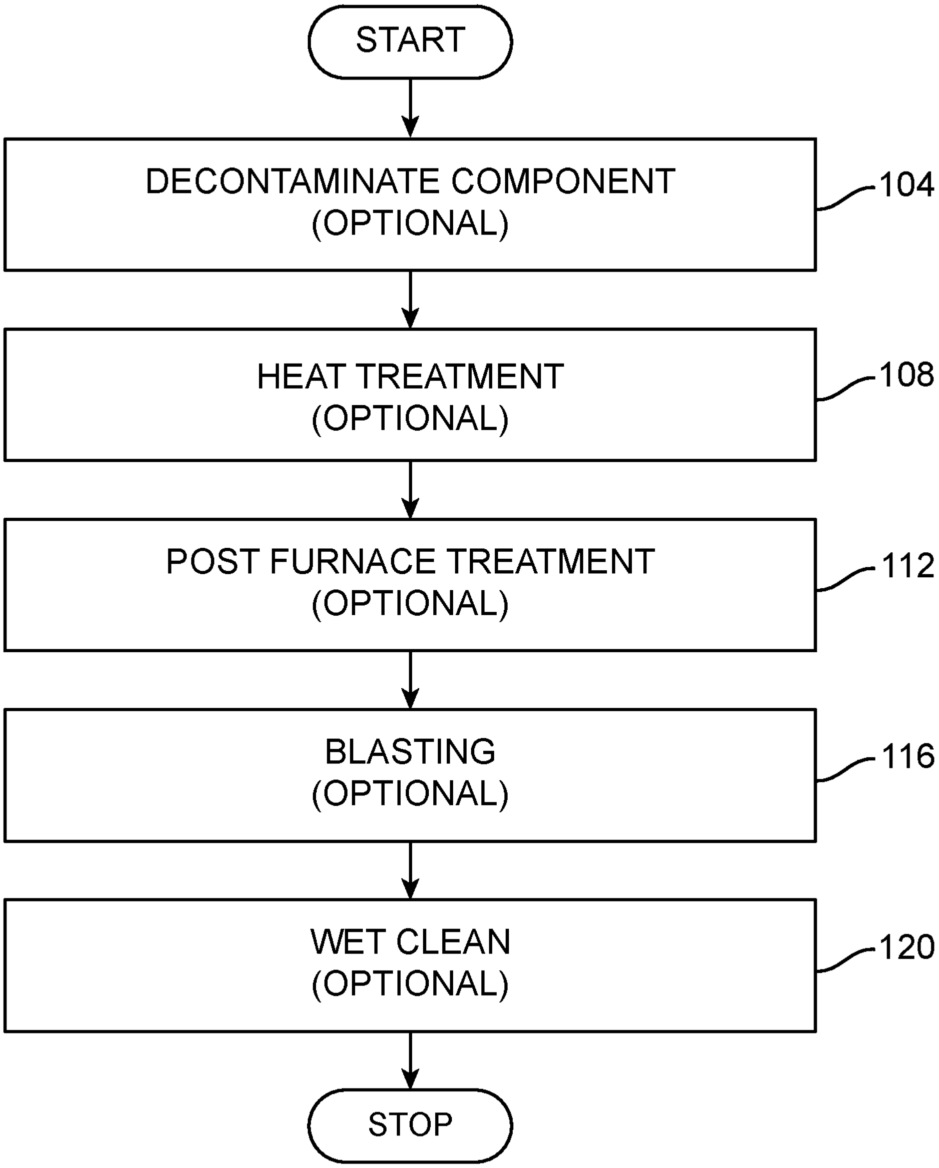
FIG. 1 is a high level flow chart of a process that may be used in an embodiment.

The present disclosure will now be described in detail with reference to a few preferred embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well known process steps and/or structures have not been described in detail in order to not unnecessarily obscure the present disclosure.

Some components of semiconductor processing chambers, such as dielectric windows are exposed to plasma used to process semiconductor devices. Dielectric windows separate the interior of a semiconductor processing chamber from the exterior of the semiconductor processing chamber. A coil is placed outside of the dielectric window. Power is transmitted from the coil through the dielectric window to inside the semiconductor processing chamber. Dielectric windows may be made of aluminum oxide ($Al_2O_3$), also called alumina, ceramic. Aluminum oxide ceramic has sufficient mechanical strength, thermal uniformity, low loss RF (radio frequency) transmission, a low cost, a high direct current (DC) electrical resistance, and is easy to machine. When exposed to a fluorine plasma alumina oxide ceramic becomes fluorinated creating particle contaminants. Yttria ($Y_2O_3$) ceramic may be thermal sprayed onto a plasma facing surface of the dielectric window to provide a protective coating that makes the dielectric window more etch resistant. Such a thermal spray coating has a finite thickness and therefore coating lifetime is limited. In addition, thermal coatings have a termination. Such terminations may be an additional source of particle contaminants. In addition, yttria coatings may have fluorination problems.

Ceramic parts formed using a spark plasma sintering (SPS) process have been found to have a high density, low porosity, and small grain size. The high density and small grain size can result in a higher strength part. For example, a ceramic part formed by an SPS process may be characterized by a high degree of densification, reaching nearly 100% (e.g. 99% or greater relative density, and preferably between 99.5% and 100% relative density) with isotropic properties having reduced diffusion between grains and minimized or prevented grain growth. In some embodiments, the average grain size is less than 10 microns (μm). In some embodiments, the average grain size is less than 5 microns. In some embodiments, having a density of at least 99.5% results in a porosity of less than 0.5%, where porosity is defined by the volume of the pores divided by the total volume. In some embodiments, having a density of at least 99% results in a porosity of less than 1%. Regarding the surface of these types of ceramic part, "surface pits" will likely be present. Ceramic densification/porosity level can correlate to the occurrence rate and size/diameter of "surface pits." In some embodiments, a ceramic with higher density, less porosity, and smaller grains can have "surface pits" that are less than 5 μm in diameter. As "surface pits" shrink in size/diameter they, in general, become hard to access/clean. Any potential debris that are trapped inside "surface pits" become fall-on particle(s) or is viewed as contamination risk during part usage in a plasma chamber. Thus the ability to clean "surface pits" is similarly vital to ceramic part performance in a plasma chamber as achieving higher densification, lower porosity, and smaller grain size.

The ceramic part may be further processed (e.g., polishing and machining) to specifically adapt the ceramic part to be a component for use in a semiconductor processing chamber. The sintering, polishing, and machining cause contaminants to be deposited on the surface of the ceramic part. If the contaminants are not removed, the contaminants may cause defects in devices that are manufactured using the component.

In addition, certain laminated ceramics change optical properties when subjected to plasma or other source of UV light during the manufacturing or use of a component. One type of change of the optical properties is a change in color or discoloration of a part. Such a discoloration is not appealing and may also indicate the presence of a contaminant. An embodiment removes or reduces the change in the optical property, so that the optical property of a component treated by an embodiment is closer to the original optical property than the optical property after exposure to UV light. In addition, change in the optical property by an embodiment may be used as an indicator that the component is made of a specific laminate ceramic and therefore may be used to identify the material forming the component.

An embodiment provides a method for conditioning ceramic components to provide a component for a semiconductor processing chamber that causes fewer defects. An embodiment is a clean ceramic component for a semiconductor processing chamber that causes fewer defects. In an embodiment, the component is a new component that has not been used in a semiconductor processing chamber and has been treated. In an embodiment, the component may be a used component that has been used in a semiconductor processing chamber and has been reconditioned.

To facilitate understanding, FIG. 1 is a high-level flow chart of an embodiment. In this example, the component is a used component. The use of the component has caused the component to change color and has deposited contaminants on the component.

The component is decontaminated (step 104). In an embodiment, the decontamination process may be achieved by a deionized water rinse and then a drying process. In various embodiments, the decontamination process may be provided by providing one or more of a solvent, detergent, oxidant, base, and acid either sequentially or simultaneously. Examples of solvents are isopropanol alcohol (IPA), acetone, and/or water. An example of an oxidant is hydrogen peroxide. Examples of bases are ammonium hydroxide, tetramethylammonium hydroxide (TMAH), tetraethylammonium hydroxide (TEAH), and potassium hydroxide (KOH). Examples of acids are nitric acid ($HNO_3$), hydrogen fluoride (HF), hydrogen chloride (HCl), sulfuric acid ($H_2SO_4$), and phosphoric acid ($H_3PO_4$). The decontamination process removes contaminants that are not removed by the heat treatment and may also be more difficult to remove after the heat treatment. Such contaminants are one or more of grease, cutting, grinding, and polishing lubricants, solid polish media slurry swarf, inorganic compounds, metallic, ionic, and molecular contamination from handling and manufacturing process and or plasma chamber deposition byproducts such as nonvolatile metallics and polymeric compounds that can include but are not limited to various metallic oxides, metal oxyfluorides, oxynitrides, and fluorocarbon based polymers as just some examples.

In some embodiments, where the component is a new part, the component decontamination (step 104) comprises a blasting process. In some embodiments, the blasting process blasts particles of solid carbon dioxide ($CO_2$), also known as dry ice. In some embodiments, the component is blasted by solid $CO_2$ dry ice propelled towards at least the process facing surface of the component at approximately 25 to approximately 70 psi. In some embodiments, the decontamination process of a new component comprises a wet cleaning in a bath. In some embodiments, ultrasonic and/or megasonic energy is applied through the wet cleaning. In some embodiments, the decontamination of the new part would remove debris from pits, where the debris is caused by the manufacturing and/or machining of the new part. The removal of debris before heat treatment allows the debris to be removed before the debris is baked in by the heat treatment.

The component is then subjected to a heat treatment (step 108) in a high temperature furnace. In this embodiment, the component is placed in a furnace. In an embodiment, the furnace linearly ramps the temperature of the component to a temperature of about 800° C. over a period of between 20 to 30 hours. The component is maintained at a temperature of about 800° C. for about 8 hours. The temperature of the component is linearly cooled over a period of between 20 to 30 hours. In some embodiments, the heat treatment is provided in the presence of oxygen, such as by exposing the component to air or a saturated oxygen. In other embodiments, the component may be kept in a vacuum or held in an inert gas, such as noble gases or nitrogen. In some embodiments, the heat treatment may be provided in the presence of a reducing or forming gas. Forming gas is a mixture of hydrogen and nitrogen, that is sometimes called a dissociated ammonia atmosphere.

After the heat treatment (step 108) is completed, the component is removed from the furnace and is subjected to a post furnace treatment (step 112). In an embodiment, the post furnace treatment comprises one or more of a deionized water rinse and a chemical cleaner.

Figure 4A:
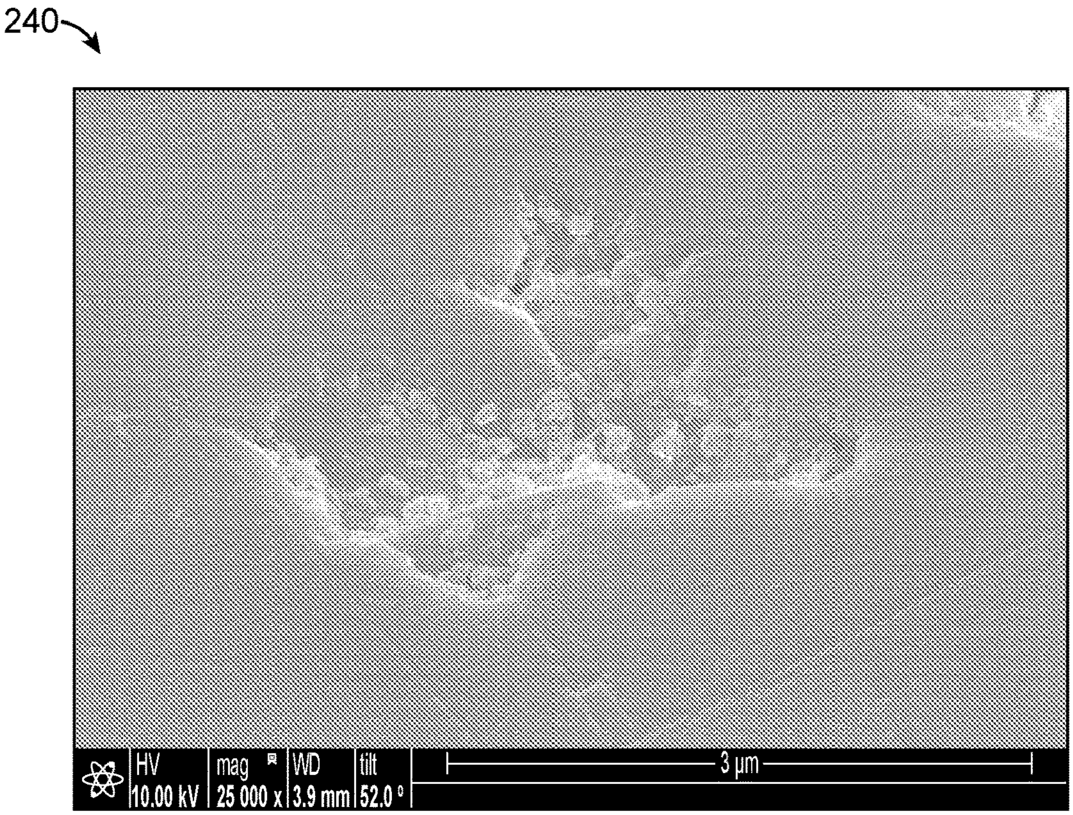
FIGS. 4A-B are photographs of top views of a component before and after nanotexturing.
Figure 4B:
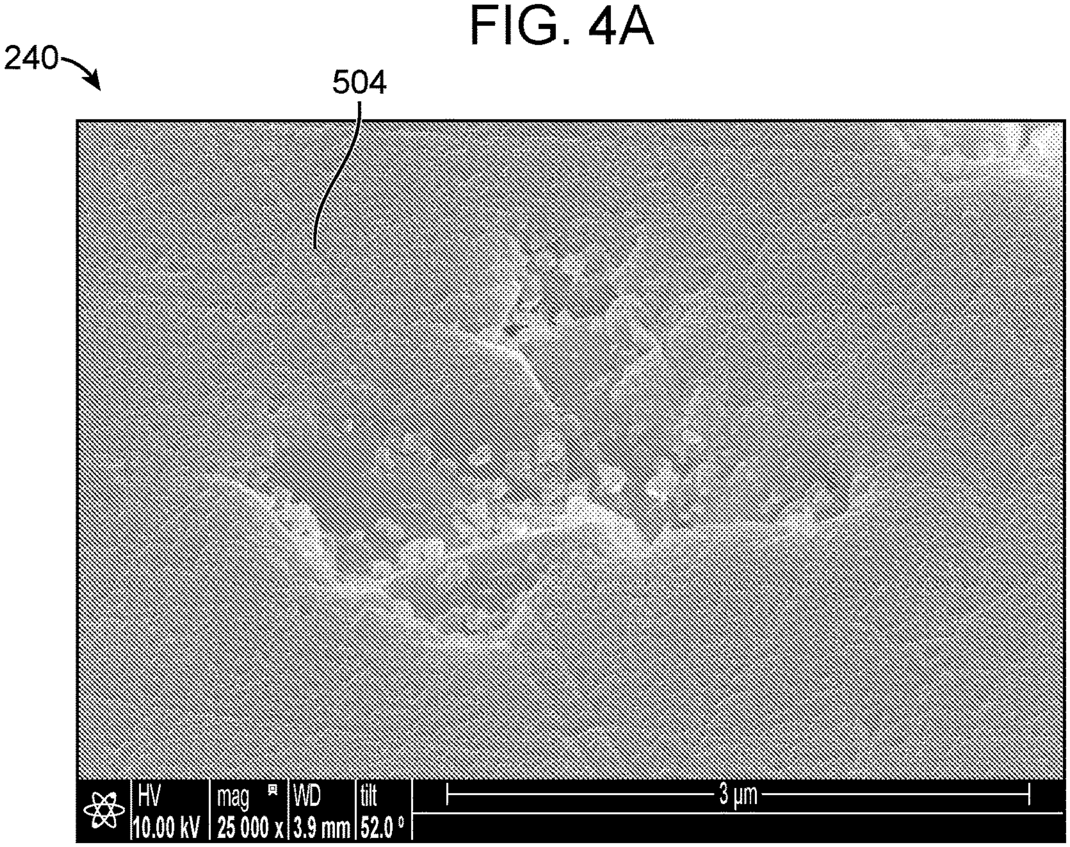

In another embodiment, the post furnace treatment comprises a step to alter the surface finish of the part to afford a nanotextured surface. A nanotextured surface is a surface with nano-sized structures. Such nano-sized structures would be between 0.1 and 100 nm deep. The nanotexturing provides a surface roughness between about 5 nm and 254 nm RA, as described in ASME B46.1. This additional surface treatment may be required to modify surface morphology and/or pre-condition surfaces of a new part prior to plasma chamber usage to improve and/or meet plasma chamber seasoning and matching performance. Such processing may also be used to promote better chamber byproduct adhesion if the need arises. One or more heated chemical soak steps either alone or in combination with surface assisted grit blasting step followed by a chemical soak step can be used to change the surface nano-roughness on the part. For example, physical bead or grit micro-blasting followed by wet chemical etch can be used whereby the etch successively removes surface defects left behind such as loose surface particles, blasting media, and/or cracks within the depth of damage. Alternatively, a chemical soak step can also be used to selectively etch, highlight, and or remove any undesirable phase domains or unwanted byproducts at any potential domain boundaries that may exist within sintered bulk material. Some examples of heated chemical soaks targeting the bulk laminate film layer can include use of inorganic acids such as $H_3PO_4$, $H_2SO_4$, HCl, chromic acid, and/or HF, as just some examples. Other alternatives can include a heated basic solution such as KOH for example. Such nanotexturing is unique to embodiments of the laminate ceramic material. Such nanotexturing may not be possible with other ceramic materials. FIG. 4A is an enlarged photograph of part of the surface of the component 240 before the nanotexturing process. FIG. 4B is an enlarged photograph of part of the surface of the component 240 after the nanotexturing process. It can be seen that the nanotexturing process increases the number of nanotexture features 404.

In another embodiment surface nanotexturing can also be achieved through use of top down or bottom up nanolithographic template assisted techniques to pattern a nano-engineered surface morphology within the laminate film layer that achieves the desired surface characteristics in the material that is plasma facing.

After the post furnace treatment (step 112), a blasting process is provided (step 116). In this embodiment, the blasting process blasts particles of solid carbon dioxide ($CO_2$), also known as dry ice. In this embodiment, the component is blasted by solid $CO_2$ dry ice propelled towards at least the process facing surface of the component at approximately 25 to approximately 70 psi. Additionally, examples of the $CO_2$ dry ice blasting pressure include approximately 20 psi, approximately 25 psi, approximately 30 psi, approximately 35 psi, approximately 40 psi, approximately 50 psi, approximately 60 psi, approximately 70 psi, and all other ranges formed from combinations of those disclosed values here. The dry ice shavings are produced from high purity solid blocks or pellets passed through a hopper equipped with a series of rotary blades that are fed at rates of approximately 0.5 pounds/min, approximately 1 pound/min, approximately 1.25 pound/min, approximately 1.5 pounds/min, approximately 1.75 pounds/min, approximately 2 pounds/min, approximately 2.5 pounds/min, approximately 2.75 pounds/min, approximately 3 pounds/min, up to 4 pounds/min and all other ranges that are formed from combinations of aforementioned pressures and feed rates. In an embodiment, the dry ice blasting step is continued for approximately 30 seconds to approximately 60 minutes using a fan shaped dispense nozzle that impinges a stream of submicron shaved ice particles within a 1-1.5 inch swath spray pattern onto the working surface from a distance ranging from approximately 1-12 inches away at an angle that ranges anywhere from shallow glancing to orthogonal with the working surface. In another embodiment, the $CO_2$ dry ice blasting of the surface is continued for approximately 8 to approximately 30 minutes. In another embodiment, the $CO_2$ dry ice blasting of the part is continued for approximately 18 to approximately 45 minutes. Additionally, examples of the $CO_2$ dry ice blasting duration include approximately 2 minutes, approximately 4 minutes, approximately 6 minutes, approximately 8 minutes, approximately 10 minutes, approximately 15 minutes, approximately 30 minutes, approximately 60 minutes and all ranges formed from combinations of spray times, working distances, and spray angles as mentioned.

The dry ice particles provide non-abrasive blasting particles that do not change the shape of the processing facing surface while removing debris. It has been found that blasting with dry ice particles is able to remove debris from pits with diameters less than 5 μm without changing the shape of the pits. Damage to surrounding polished bulk surfaces is also avoided. In other embodiments, other non-damaging abrasive particles that are bound to conformal media such as scrub pads or sponges can be used to remove heavy bulk surface contamination. These materials would typically have a hardness that is close to or less than the sintered bulk metal oxide material to avoid surface damage and can include various imbedded particle size/grits that can be applied through use of $Al_2O_3$ based pads and/or various sponge types. In other embodiments, softer non-abrasive media such as use of polyvinyl acetate (PVA), polypropylene, nylon, or polyester based high-density snag-free specialty cleaning wipers may be used. In other embodiments, more abrasive harder type particles such as various diamond grits can also be used in order to both remove stubborn more well adhered debris and to refurbish polish the surface. In some embodiments, a hydrojet wash with a targeting nozzle may be used in place of or in combination with blasting to remove debris.

After the blasting is completed (116), a precision wet clean is provided (step 120). In an embodiment, the component is placed in one or more wet clean baths. In another embodiment the component is first cleaned such that the various chemistries used to clean the part are applied to the surface of the part through sequential wiping and rinsing sequences prior to placing the parts in a bath that may contain ultrasonic or megasonic energy. Megasonic or ultrasonic energy may be used in combination or in absence of heating to provide energy to enhance the wet clean. Examples of megasonic or ultrasonic energy that may be used in embodiments, the megasonic or ultrasonic energy may have frequencies of 40 kHz, 78 kHz, 100 kHz, 130 kHz, 170 kHz, 200 kHz, 220 kHz, 270 kHz, 430 kHz, and may include frequencies in the megahertz region. In various embodiments one or more wet clean baths may be sequentially provided. A wet clean bath may have one or more of a solvent, detergent, oxidant, base, acid, or only deionized water. Examples of solvents are isopropanol alcohol (IPA), acetone, and/or water. An example of an oxidant is hydrogen peroxide. Examples of bases are ammonium hydroxide, tetramethylammonium hydroxide (TMAH), tetraethylammonium hydroxide (TEAH), and potassium hydroxide (KOH). Examples of acids are nitric acid ($HNO_3$), hydrogen fluoride (HF), hydrogen chloride (HCl), sulfuric acid ($H_2SO_4$), and phosphoric acid ($H_3PO_4$). The precision wet clean removes any leftover residual organic compounds, inorganic compounds, ionic and/or molecular contamination that may have remained on the part through prior steps or that is potentially picked up from part handling and/or environments encountered at any intermediate preceding step.

In an embodiment, the component is a dielectric window for a semiconductor processing chamber. In this embodiment, the component is a laminated ceramic component. In an embodiment, the component is made by filling a mold with a base zone powder. In this embodiment, the base zone powder is a first dielectric ceramic material comprising a metal oxide powder. In this embodiment, the metal oxide powder is a mixture of aluminum oxide and zirconia powder. In this example, the metal oxide powder comprises a mixture of aluminum oxide and zirconia. In other embodiments, the window body dielectric powder may comprise aluminum nitride and aluminum oxide.

A protective zone powder is placed in the mold filled with a window body dielectric powder, providing a layer of the protective zone powder in the mold. In this embodiment, the protective zone powder is a second dielectric ceramic material comprising at least one of a mixed metal oxide and a mixed metal oxyfluoride and a metal fluoride, wherein the first dielectric ceramic material is different than the second dielectric ceramic material. In this example, the protective zone powder comprises at least one of aluminum oxide, yttrium oxide, zirconium oxide, and magnesium oxide, yttrium aluminum oxide, magnesium aluminum oxide, magnesium fluoride, and yttrium aluminum oxyfluoride. In this embodiment, the protective zone powder forms a layer that has a thickness of between about 0.1 mm and 10 mm. In other embodiments, the protective zone powder forms a layer that has a thickness of between about 0.5 mm and 5 mm.

In this embodiment, the base zone powder and the protective zone powder are co-sintered together to form a dielectric component. Various embodiments may use various sintering processes. In this embodiment, the sintering process is a spark plasma sintering (SPS) process. In this embodiment, an upper punch is placed over the base zone powder and the protective zone powder. A power source is electrically connected between the lower punch and the upper punch. The power source may be a pulsed power source or a continuous power source. In this embodiment, the mold is placed between a lower press and an upper press.

As compared to other sintering processes, the SPS process (also referred to as pulsed electric current sintering (PECS), Field-Assisted Sintering (FAST) or Plasma Pressure Compaction (P2C)) involves contemporaneous use of pressure and high-intensity, low-voltage (e.g. 5-12 V), current to dramatically reduce processing/heating times (e.g. 5-10 minutes (min) instead of several hours) and yield high-density components. In this embodiment, the current is a pulsed DC current. In one embodiment, a pulsed DC current is transmitted by the power source through the lower punch and the upper punch to the base zone powder and the protective zone powder, while pressure (e.g. between 10 megapascals (MPa) up to 500 MPa or more) is simultaneously axially applied to the base zone powder and the protective zone powder from the lower press and upper press through the lower punch and the upper punch to the base zone powder and the protective zone powder under mono-axial mechanical force. A "mono-axial force" is herein defined to mean a force applied along a single axis or direction creating mono-axial compression. The mold is generally placed under a vacuum during at least a portion of the process. Pulsed-current patterns (ON:OFF), typically in milliseconds, enable high heating rates (up to 1000° C./min or more), and rapid cooling/quenching rates of (up to 200° C./min or more) for heating the sintering powder to temperatures ranging from under 1000° C. to 2500° C.

In one embodiment of an SPS process, provided for exemplary purposes only, sintering of the composition of sintering powder is conducted under vacuum ($6<P$ (Pascals (Pa))$<14$) while being simultaneously subjected to a pulsed current. The SPS thermal treatment may be implemented as follows: 1) a degassing treatment performed for a period between 3 minutes (min) to 10 min, and preferably with the base zone powder and the protective zone powder subjected to an applied load (e.g. between 10 MPa and 20 MPa) for 3 min and increasing load up to 40 MPa to 100 MPa for 2 min., and 2) heating up to between 1000° C. and 1500° C. at 100° C. $min^{-1}$ under an applied load between 40 MPa to 100 MPa and a soaking time of 5 min at maximum temperature then cooling down to room temperature. In other embodiments, the temperature range is from 1100° C. to 1300° C. It is appreciated that one or more of the SPS process parameters, including composition constituent ratios and particulate size, pressures, temperatures, treatment periods, and current pulse sequences, may be varied as appropriate to optimize the SPS process.

Figure 2:
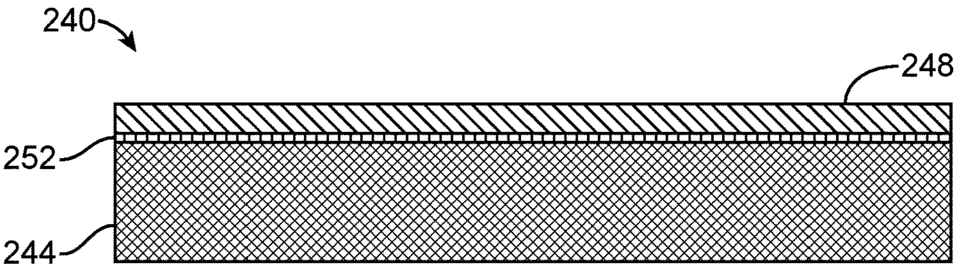
FIG. 2 is a schematic cross-sectional view of a component formed by a sintering process.

FIG. 2 is a schematic cross-sectional view of a component 240 formed by the sintering process, wherein the component is treated by an embodiment. The component comprises a component body comprising a base zone 244 formed from the base zone powder, a protective zone 248 formed from the protective zone powder, and a transition zone 252 formed from a mixture of both the base zone powder and the protective zone powder. The transition zone 252 may provide a gradient where near the base zone 244, the transition zone 252 is almost all base zone powder with a little protective zone power, and where the percentage of the protective zone powder increases closer to the protective zone 248 until the transition zone 252 is almost all protective zone powder with a little base zone powder. The gradient provided by the transition zone provides a transition of the coefficient of thermal expansion (CTE) between the base zone 244 and the protective zone 248, reducing cracking due to a CTE mismatch. In addition, the transition zone forms a rough interface that increases adhesion between the base zone 244 and the protective zone 248, reducing delamination, spalling, and flaking.

The component 240 is characterized by a high degree of densification, reaching nearly 100% (e.g. 99% or greater relative density, and preferably between 99.5% and 100% relative density) with isotropic properties having reduced diffusion between grains and minimized or prevented grain growth. In some embodiments, the average grain size is less than 10 microns (μm). In some embodiments, the average grain size is less than 5 microns. In some embodiments, having a density of at least 99.5% results in a porosity of less than 0.5%, where porosity is defined by the volume of the pores divided by the total volume. In some embodiments, having a density of at least 99% results in a porosity of less than 1%. The high density and low grain size result in a higher strength part.

The component 240 may be further processed (e.g., polishing, machining, or like process) to specifically adapt the component 240 to be a component for use in a semiconductor processing chamber. It has been found that the surface of the component 240 has a plurality of pits that are less than 5 μm in diameter. After the manufacturing of the component 240 and after the machining and polishing of the surface of the component 240, the plurality of pits that are less than 5 μm in diameter of the surface are on average filled more than 75% by debris. In an embodiment, after the component is sintered, machined, and polished, the treatment shown in FIG. 1 may be provided. It has been found that after the treatment the plurality of pits that are less than 5 μm in diameter was on average less than 15% filled with debris.

Figure 3:
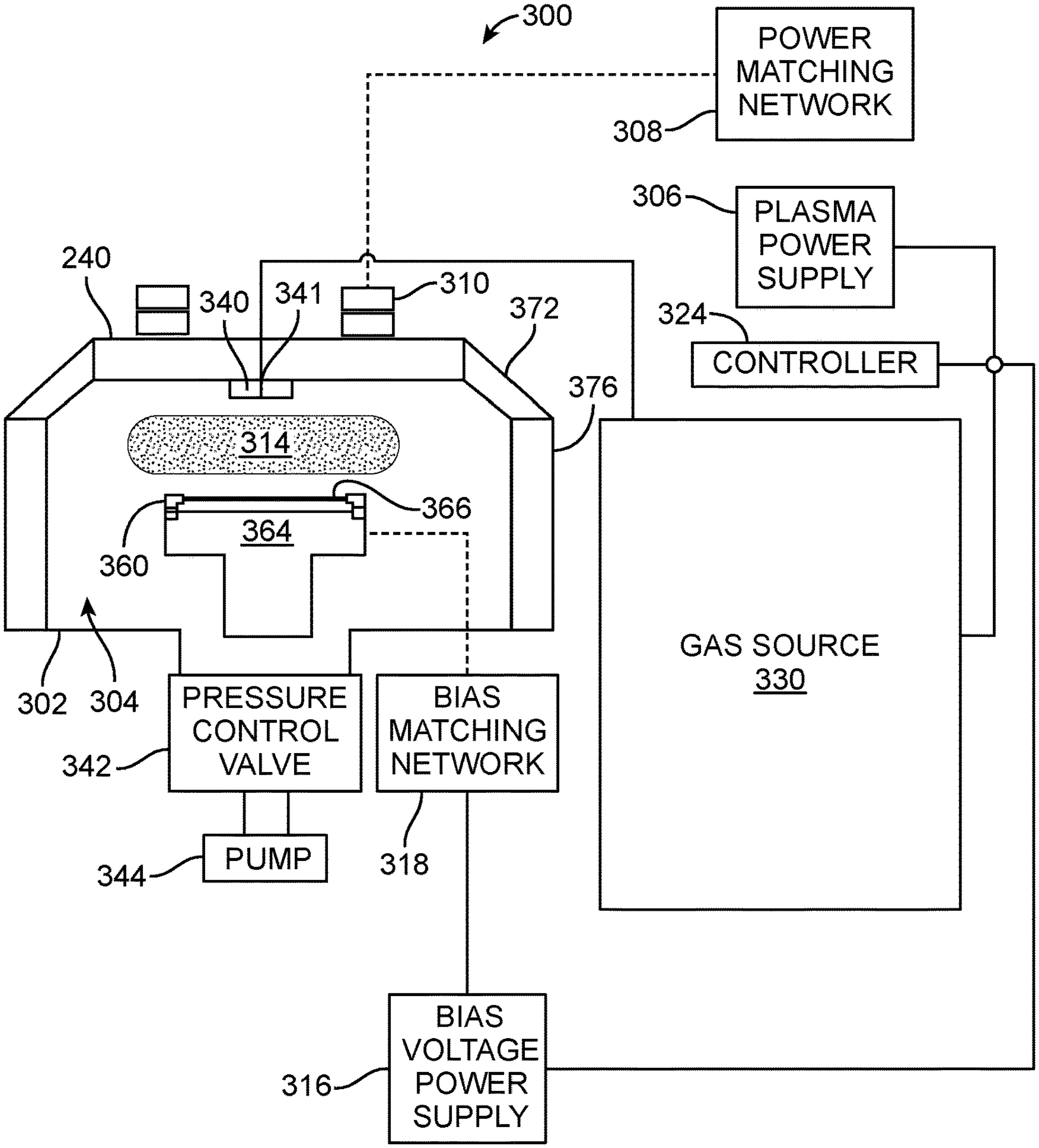
FIG. 3 is a schematic view of a semiconductor processing chamber that is used in an embodiment.

The component 240 is mounted as a component of a semiconductor processing chamber. To facilitate understanding, FIG. 3 schematically illustrates an example of a semiconductor processing chamber system 300 that may be used in an embodiment. The semiconductor processing chamber system 300 includes a reactor 302 having a processing chamber 304 therein. A plasma power supply 306, tuned by a power matching network 308, supplies power to a transformer coupled plasma (TCP) coil 310 located near a dielectric inductive dielectric window formed by the component 240. The TCP coil 310 creates a plasma 314 in the semiconductor processing chamber 304 by providing an inductively coupled power into the reactor 302 through the component 240. A pinnacle 372 extends from a chamber wall 376 of the processing chamber 304 to the inductive dielectric window forming a pinnacle ring. The pinnacle 372 is angled with respect to the chamber wall 376 and the inductive dielectric window. For example, the interior angle between the pinnacle 372 and the chamber wall 376 and the interior angle between the pinnacle 372 and the inductive dielectric window may each be greater than 90° and less than 180°. The pinnacle 372 provides an angled ring near the top of the semiconductor processing chamber 304, as shown. The TCP coil (upper power source) 310 may be configured to produce a uniform diffusion profile within the semiconductor processing chamber 304. For example, the TCP coil 310 may be configured to generate a toroidal power distribution in the plasma 314. The inductive dielectric window is provided to separate the TCP coil 310 from the semiconductor processing chamber 304 while allowing energy to pass from the TCP coil 310 to the semiconductor processing chamber 304. A wafer bias voltage power supply 316 tuned by a bias matching network 318 provides power to substrate support 364 to set the bias voltage when a process wafer 366 is placed on the substrate support 364. A controller 324 controls the plasma power supply 306 and the wafer bias voltage power supply 316.

The plasma power supply 306 and the wafer bias voltage power supply 316 may be configured to operate at specific radio frequencies such as, for example, 13.56 megahertz (MHz), 27 MHz, 2 MHz, 60 MHz, 400 kilohertz (kHz), 2.54 gigahertz (GHz), or combinations thereof. Plasma power supply 306 and wafer bias voltage power supply 316 may be appropriately sized to supply a range of powers in order to achieve the desired process performance. For example, in one embodiment, the plasma power supply 306 may supply the power in a range of 50 to 5000 Watts, and the wafer bias voltage power supply 316 may supply a bias voltage in a range of 20 to 2000 volts (V). In addition, the TCP coil 310 and/or the substrate support 364 may be comprised of two or more sub-coils or sub-electrodes. The sub-coils or sub-electrodes may be powered by a single power supply or powered by multiple power supplies.

As shown in FIG. 3, the semiconductor processing chamber system 300 further includes a gas source/gas supply mechanism 330. The gas source 330 is in fluid connection with semiconductor processing chamber 304 through a gas inlet, such as a gas injector 340. The gas injector 340 has at least one borehole 341 to allow gas to pass through the gas injector 340 into the semiconductor processing chamber 304. The gas injector 340 may be located in any advantageous location in the semiconductor processing chamber 304 and may take any form for injecting gas. Preferably, however, the gas inlet may be configured to produce a "tunable" gas injection profile. The tunable gas injection profile allows independent adjustment of the respective flow of the gases to multiple zones in the semiconductor processing chamber 304. More preferably, the gas injector is mounted to the component 240. The gas injector may be mounted on, mounted in, or form part of the dielectric window. The process gases and byproducts are removed from the semiconductor processing chamber 304 via a pressure control valve 342 and a pump 344. The pressure control valve 342 and pump 344 also serve to maintain a particular pressure within the semiconductor processing chamber 304. The pressure control valve 342 can maintain a pressure of less than 1 Torr during processing. An edge ring 360 is placed around the top part of the substrate support 364. The gas source/gas supply mechanism 330 is controlled by the controller 324. A Kiyo®, Strata®, or Vector® by Lam Research Corp.® of Fremont, CA, may be used to practice an embodiment.

The semiconductor processing chamber is used to process a plurality of wafers. The processing performed by the processing chamber may include one or more processes of etching, depositing, passivating, or another semiconductor process. The semiconductor processing may be at least one of a plasma processing and non-plasma processing. The protective zone 248, shown in FIG. 2, faces the plasma 314, shown in FIG. 3.

Figure 5A:
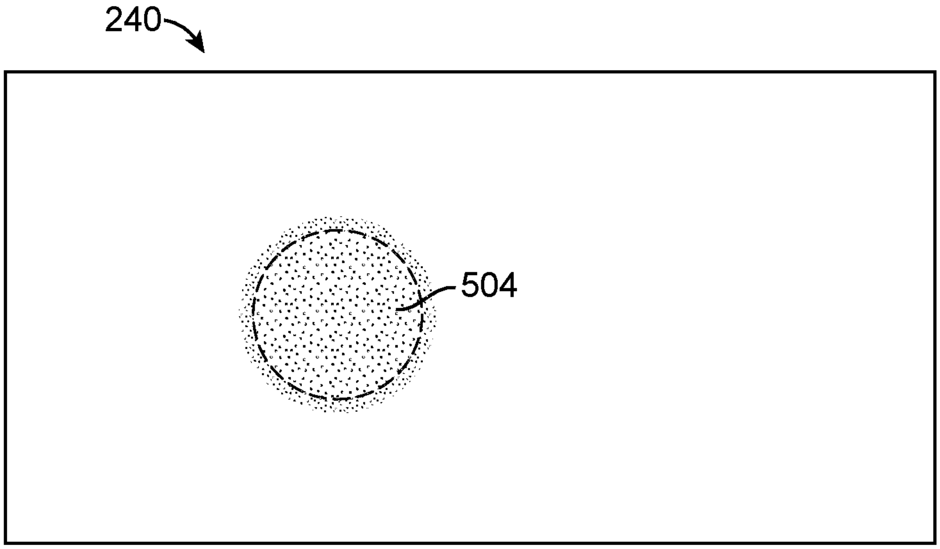
FIGS. 5A-B are photographs of part of the surface of the component before and after treatment.
Figure 6A:
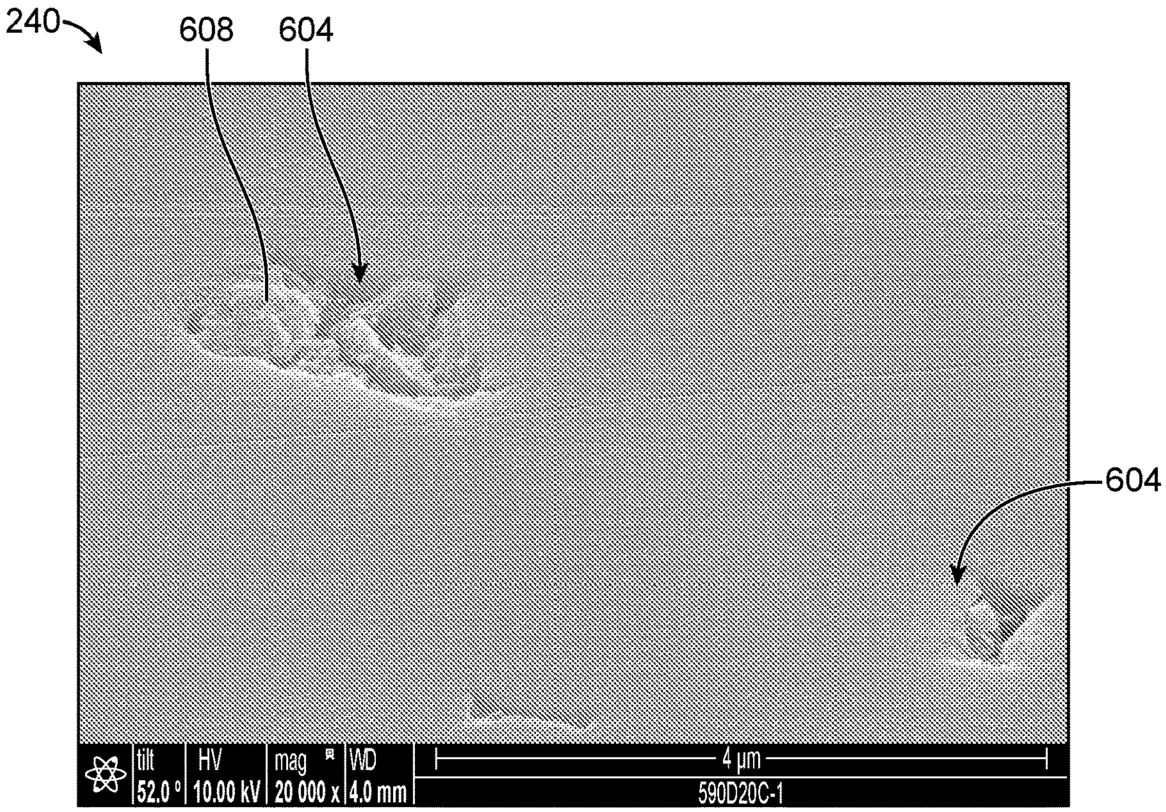
FIGS. 6A-B are photographs of another part of the surface of the component before and after treatment.

After the plurality of wafers has been processed the component 240 is removed from the semiconductor processing chamber 304 for the treatment shown in FIG. 1 in order to recondition the component 240. The reconditioning may be required as a result of process drift or an increase in defects caused by the component after a certain number of wafers have been processed. FIG. 5A is a photograph of a top view of a component 240 after the component 240 has been used in a semiconductor processing chamber 304 to process a plurality of wafers. A region 504 of the surface of the component 240 has been discolored by the semiconductor processing. FIG. 6A is a photograph of part of the magnified surface of the component 240. The surface of the component has a plurality of pits 604 that are less than 5 μm in diameter. In addition, the plurality of pits 604 that are less than 5 μm in diameter has been found to be on average to be more than 75% filled by debris 608.

The component 240 is treated using the process shown in FIG. 1. In an embodiment the component is first decontaminated using sequential wiping followed by deionized water (DIW) rinse steps. More specifically this can include the use of IPA, followed by deionized water rinse, followed by wiping with a mix acid mixture of deionized water and $HF/H_2O_2$, followed by another deionized water rinse. The component is then subjected to a heat treatment (step 108) in a high temperature furnace where the furnace linearly ramps the temperature of the component to a temperature of about 800° C. over a period of between 20 to 30 hours. The component is maintained at a temperature of about 800° C. for about 8 hours. The temperature of the component is linearly cooled over a period of between 20 to 30 hours. After the heat treatment (step 108) is completed, the component is removed from the furnace and is subjected to a post furnace treatment comprising of one or more of a deionized water rinse and a chemical cleaning sequence that can include the use of IPA, followed by deionized water rinse, followed by wiping with an acid mixture of deionized water and $HF/H_2O_2$, followed by another deionized water rinse, followed by wiping with a basic mixture of ammonium hydroxide and hydrogen peroxide ($NH_4OH/H_2O_2$) and deionized water, followed by another rinse. After the post furnace treatment (step 112) and decontamination (step 104), a blasting process where particles of solid carbon dioxide ($CO_2$), also known as dry ice is to follow. Solid $CO_2$ dry ice is propelled towards at least the process facing surface of the component at approximately 25 to approximately 70 psi at feed rates of approximately 0.5 to 4 pounds/min, for approximately 30 seconds to approximately 60 minutes.

After the blasting is completed (116), a precision wet clean is to follow (step 120). The component is first cleaned such that the various chemistries used to clean the part described next are applied to the surface of the part through sequential wiping and rinsing sequences prior to placing the parts in a bath that may contain ultrasonic or megasonic energy. The wet clean wipe sequence may have one or more of a solvent step, followed by a detergent soak step, followed by a chemical oxidant soak step, followed by a chemical base wipe step, followed by a chemical acid wipe step, prior to the final ultrasonication steps. Deionized rinse steps can follow each of the forementioned individual steps. Example of solvent can be isopropanol alcohol (IPA), and acetone. An example of an oxidant can be hydrogen peroxide. Example of base can include an ammonium hydroxide and hydrogen peroxide mixture. Example of an acid can be a nitric acid ($HNO_3$) mixture, and or a hydrogen fluoride (HF) and hydrogen peroxide mixture.

Megasonic or ultrasonic energy may be used after chemical cleaning in combination or in absence of heating to provide additional energy to enhance any of the wet clean steps. The megasonic or ultrasonic energy may have any of the following frequencies or combinations thereof 40 kHz, 78 kHz, 100 kHz, 130 kHz, 170 kHz, 200 kHz, 220 KHz, 270 kHz, 430 kHz, and may include frequencies in the megahertz region. In various cases, one or more wet clean baths may be sequentially required in the final stages of the precision clean just prior to blow drying and final bake out of the part.

Figure 5B:
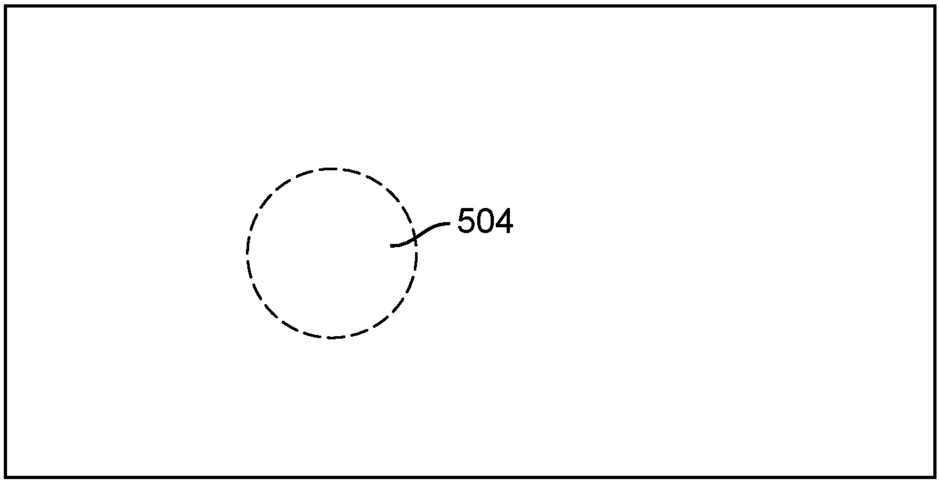

FIG. 5B is a photograph of a top view of a component 240 after the treatment has been provided. The region 504 of the surface of the component 240 is no longer discolored. In addition, the coloring of the component 240 is more uniform across the plasma facing surface.

Figure 6B:
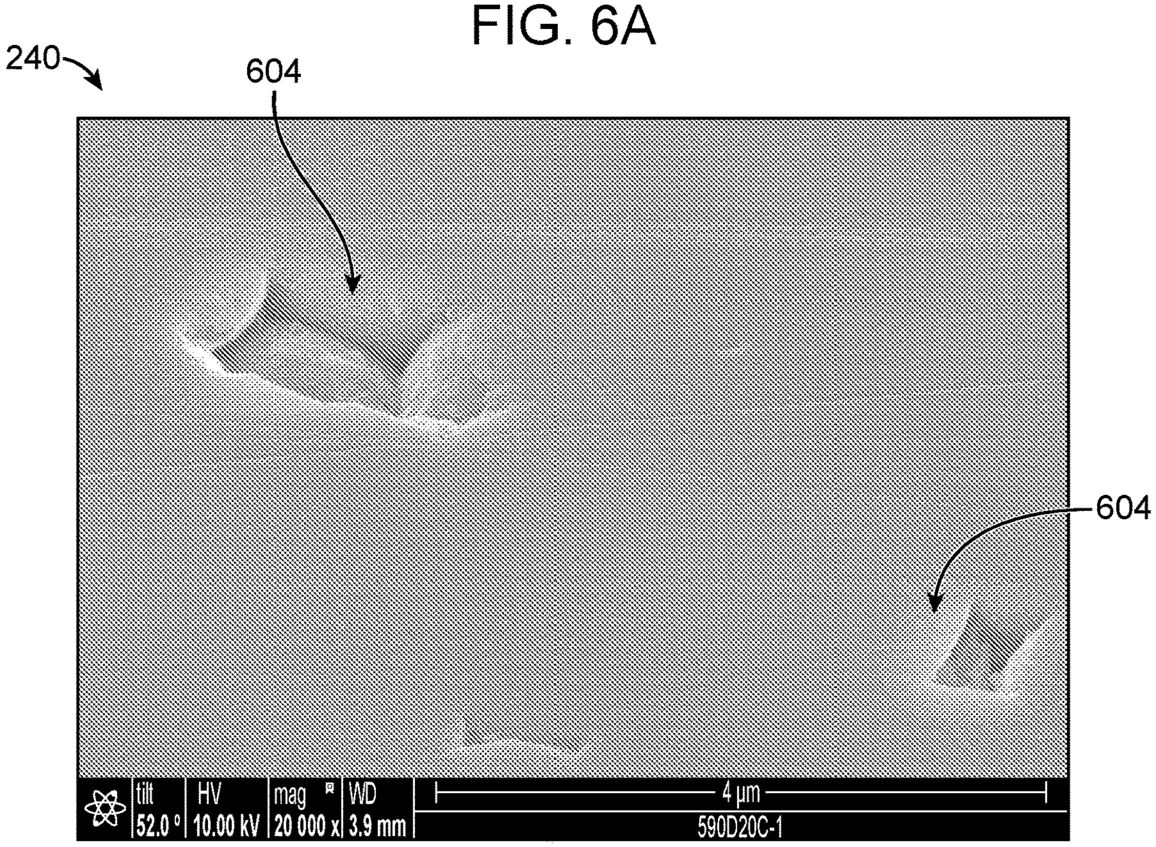

In order to recondition the used component 240, the treatment shown in FIG. 1 may be provided. It has been found that after the treatment the plurality of pits that are less than 5 μm in diameter was on average less than 15% filled with debris. FIG. 6B is an enlarged photograph of part of the surface of the component 240 after the treatment has been provided. After treatment, the plurality of pits 604 that are less than 5 μm in diameter has been found to be on average to be less than 15% filled by debris 608.

In other embodiments, the component 240 may form other parts of the semiconductor processing chamber system 300. For example, the component 240 may be walls of the semiconductor processing chamber. More specifically, the component 240 may be walls of a semiconductor processing chamber system 300 where inductive power is passed through the component 240 from the outside of the semiconductor processing chamber system 300 into the semiconductor processing chamber system 300.

In other embodiments, the component 240 may be parts of other types of semiconductor processing chambers such as a bevel plasma processing chambers or like devices. Examples of components of semiconductor processing chambers that may be provided in various embodiments are dielectric windows, walls, liners, such as a pinnacle, showerheads, gas injectors, and edge rings of plasma processing chambers. In various embodiments, the dielectric windows may be flat, or dome shaped or may have other shapes. If gas bores pass through the component, the low porosity helps protect the component from gases passing through the gas bores.

By co-firing the different base zone powder 220 and the protective zone powder 224 the different base zone 244 and protective zone 248 are formed as layers laminated together to form a ceramic laminate component. These laminated layers have a bonding that prevents separation and termination. The low porosity of the component 240 further reduces erosion.

In various embodiments, a protective zone may have a thickness of about 5 mm. In some embodiments, less than 4 mm of the protective zone is eroded 10,000 RF hours of use. Such an embodiment allows for use of the dielectric component 240 for about 10,000 RF hours without requiring a changing of the dielectric component 240. Having a part that lasts for 10,000 RF hours reduces maintenance costs and downtime.

In some embodiments, a base zone 244 of zirconium toughened alumina is used with a protective zone 248 of yttrium aluminum oxide. Zirconium toughened alumina and yttrium aluminum oxide have coefficients of thermal expansion that are close enough to reduce cracking. In some embodiments, a new component exposed to ultraviolet (UV) light during the manufacturing or exposed to UV light during usage will have a change of part of the component from a first optical state to a second optical state. The change in optical property could be a change in color (a discoloration). As a result, the component may not be of a uniform color. The treatment provided by an embodiment changes the optical property of the part of the component from the second optical state to a third optical state. The third optical state is closer to the first optical state than to the second optical state. As a result, the color of the component may be more uniform than the color of the component before treatment. The ability to restore the optical property by the treatment may also be used to indicate that the component is a ceramic laminate of zirconium toughened alumina and yttrium aluminum oxide. In some embodiments, the heat treatment ramps the temperature of the component to a soak temperature of between 400° C. to 1000° C. for a period between 2 hours to 20 hours. The ramping must be slow enough to prevent damage to the component. The soak temperature must be high enough to change the optical properties of part of the component in order to provide a more uniform optical property. The soak temperature must be low enough to prevent damage to the component.

While this disclosure has been described in terms of several preferred embodiments, there are alterations, permutations, and various substitute equivalents, which fall within the scope of this disclosure. It should also be noted that there are many alternative ways of implementing the methods and apparatuses of the present disclosure. It is therefore intended that the following appended claims be interpreted as including all such alterations, permutations, methods, and various substitute equivalents as fall within the true spirit and scope of the present disclosure. As used herein, the phrase "A, B, or C" should be construed to mean a logical ("A OR B OR C"), using a non-exclusive logical "OR," and should not be construed to mean 'only one of A or B or C. Each step within a process may be an optional step and is not required. Different embodiments may have one or more steps removed or added or may provide steps in a different order. In addition, various embodiments may provide different steps simultaneously instead of sequentially.

What is claimed is:

1. A ceramic component, for use in a semiconductor processing chamber, wherein the ceramic component has a process facing surface with a plurality of pits with diameters less than 5 μm that are on average less than 15% filled with debris, wherein the ceramic component is a ceramic laminate comprising:

a base zone comprising a first dielectric ceramic material;

a protective zone on a first side of the base zone, wherein the protective zone comprises a second dielectric ceramic material, wherein the first dielectric ceramic material is different than the second dielectric ceramic material, and wherein the process facing surface is a surface of the protective zone; and a transition zone between the protective zone and base zone, wherein the transition zone comprises the first dielectric ceramic material and the second dielectric ceramic material.

2. The ceramic component, as recited in claim 1, further comprising a nanotextured surface of the protective zone with surface roughness of between about 5 nm and 254 nm RA.

3. The ceramic component, as recited in claim 1, wherein the protective zone, the base zone, and the transition zone have a porosity of less than 1% by volume.

4. The ceramic component, as recited in claim 1, wherein the surface of the protective zone has a uniform optical property provided by steps comprising a heat treatment for changing an optical property of a first part of the ceramic component from a first optical state to a second optical state different from the first optical state and wherein the change to the optical property of the first part of the ceramic component provides a more uniform optical property of an entire ceramic component.

5. The ceramic component, as recited in claim 4, wherein the first optical state is a first color, and the second optical state is a second color different than the first color.

6. The ceramic component, as recited in claim 1, wherein the ceramic component is a new component.

* * * * *